United States Patent [19]
Ito

[11] Patent Number: 4,791,609
[45] Date of Patent: Dec. 13, 1988

[54] SEMICONDUCTOR INTEGRATED CIRCUIT DEVICE

[75] Inventor: Soichi Ito, Tokyo, Japan

[73] Assignee: NEC Corporation, Tokyo, Japan

[21] Appl. No.: 36,521

[22] Filed: Apr. 9, 1987

[30] Foreign Application Priority Data

Apr. 9, 1986 [JP] Japan .................................. 61-82714

[51] Int. Cl.⁴ ............................................... G11C 5/06
[52] U.S. Cl. ......................................... 365/63; 365/51
[58] Field of Search ..................................... 365/51, 63

[56] References Cited

U.S. PATENT DOCUMENTS 4,525,809 6/1985 Chiba et al. ........................... 365/51

Primary Examiner—Joseph A. Popek
Attorney, Agent, or Firm—Sughrue, Mion, Zinn, Macpeak, and Seas

[57] ABSTRACT

A semiconductor integrated circuit device comprising a plurality of rows of logic cells, the rows of logic cells being spaced apart from each other to define channel areas therebetween, the logic cells being arranged to form a plurality of function blocks each having a predetermined logic function, and at least one wiring layer overlying the rows of logic cells and the channel areas, the wiring layer comprising a plurality of inter-cell wiring areas extending along the rows of logic cells and including interconnects between desired ones of the logic cells and inter-block wiring areas extending along the channel areas and including interconnects between desired ones of the function blocks. Each of the inter-cell wiring areas comprises wiring sections respectively associated with the function blocks and mostly consisting of wiring sections having widths within a predetermined range.

5 Claims, 8 Drawing Sheets

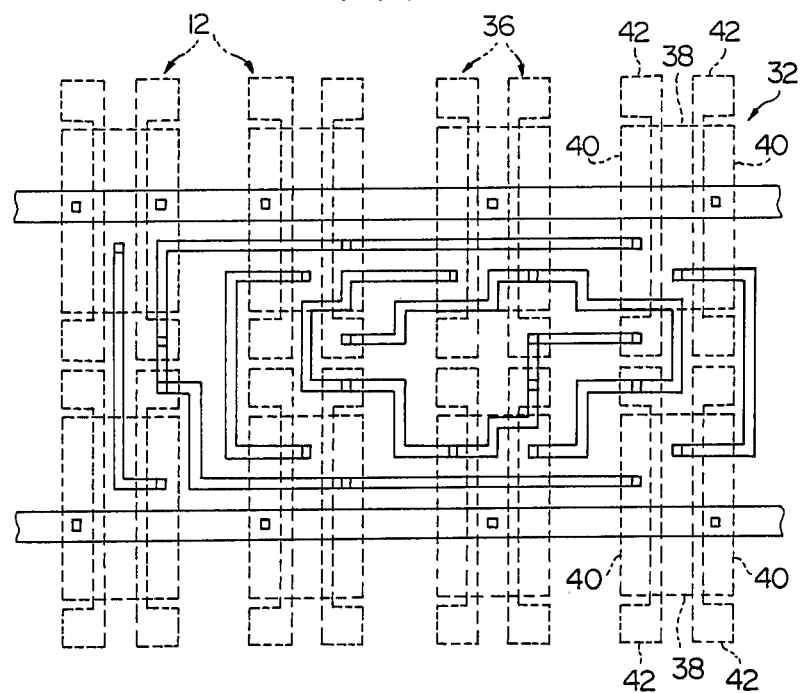

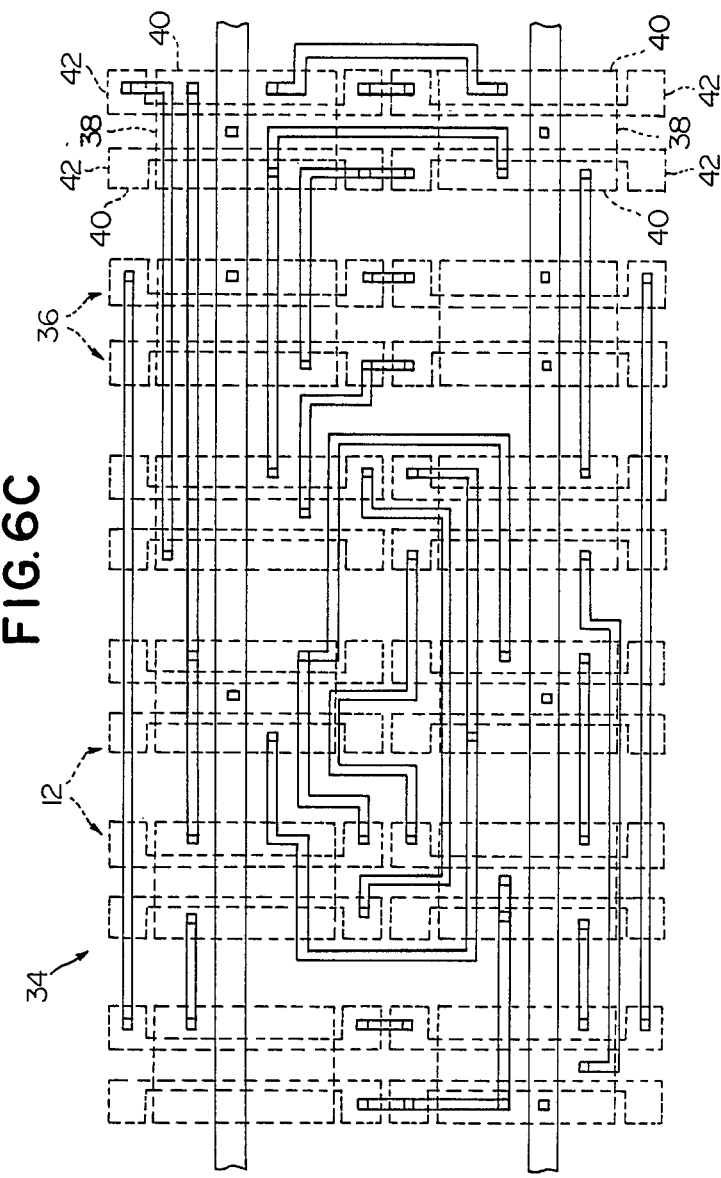

SEMICONDUCTOR INTEGRATED CIRCUIT DEVICE

FIELD OF THE INVENTION

The present invention relates to semiconductor integrated circuit devices and, more particularly, to a semiconductor large-scale integrated circuit device such as typically a transistor gate array or a standard-cell device having automated or computer-aided design layout.

BACKGROUND OF THE INVENTION

As semiconductor large-scale integrated (LSI) circuit devices are scaled up and accordingly more time is required for implementing LSI circuit device designs, computerized chip layout processes are used more frequently to reduce errors that have been involved in manual layout design procedures. Efforts are being thus directed at developing faster and error-free layout topologies commensurate with the potential capabilities of the computer-aided design (CAD) tools and procedures used for the automated chip layout processes. Typical of such layout topologies are those widely used for transistor gate arrays with regular device arrangements.

An LSI circuit chip with such a regular device distribution feature has rows of logic cells arranged to form logic-building or function blocks and fixed channel areas provided between the rows of logic cells. Over these fixed channel areas are to be formed inter-block wiring areas used principally for the routing of the interconnects between the individual function blocks while inter-cell wiring areas are to be formed over the function blocks implemented by the logic cells principally for the routing of the interconnects between the individual logic cells forming the function blocks.

In such an LSI circuit chip, the spaces required for the inter-cell wiring areas provided for the interconnection of the logic cells vary depending on the logic functions of the function blocks respectively associated with the wiring areas. Furthermore, the function blocks having approximately equal inter-cell wiring areas are distributed randomly in directions in which the function blocks are arranged in rows. By reason of such random distribution of the function blocks, there are irregularities in the width of the inter-cell wiring areas so that each of the inter-block wiring areas defined between such inter-cell wiring areas have locally broadened and narrowed portions. A problem thus arises in that the required spacings between the adjacent rows of logic cells are dictated by the widths which are allowed allocated to the narrowed portions of the inter-block wiring areas. On the other hand, the broadened portions of the inter-block wiring areas bring about a problem that the inter-block wiring areas could not be exploited effectively throughout the widths of the broadened portions. These problems lead to the requirement for an enlarged chip size and accordingly give rise to an increase in the production cost of the chip implementing the gate array.

It is, therefore, an important object of the present invention to provide an improved semiconductor LSI circuit device which will make it possible to utilize the overall real estate available for the LSI circuit device.

SUMMARY OF THE INVENTION

In accordance with one important aspect of the present invention, there is provided a semiconductor integrated circuit device comprising (a) a plurality of rows of logic cells each composed of a combination of semiconductor elements, the rows of logic cells being spaced apart from each other to define channel areas therebetween, the logic cells being arranged to form a plurality of function blocks each having a predetermined logic function, and (b) at least one wiring layer overlying the rows of logic cells and the channel areas, the wiring layer comprising a plurality of inter-cell wiring areas extending along the rows of logic cells and including interconnects between desired ones of the logic cells and inter-block wiring areas extending along the channel areas and including interconnects between desired ones of the function blocks, wherein (c) each of the inter-cell wiring areas comprises wiring sections respectively associated with the function blocks and each has a width larger or smaller than at least one predetermined width, and (d) the wiring sections forming the inter-cell wiring areas mostly consist of wiring sections having widths within a predetermined range. In a semiconductor integrated circuit device thus constructed, the function blocks may include at least one function block bridging a plurality of ones of the rows of logic cells, the aforesaid one function block being associated with a plurality of wiring sections which are disposed to form part of and bridge a plurality of ones of the inter-cell wiring areas and which include at least one wiring section larger than the other wiring sections and disposed to form part of an inter-cell wiring area mostly consisting of wiring sections having widths within a predetermined range.

In accordance with another important aspect of the present invention, there is provided a semiconductor integrated circuit device comprising (a) a plurality of rows of logic cells each composed of a combination of semiconductor elements, the rows of logic cells being spaced apart from each other to define channel areas therebetween, the logic cells being arranged to form a plurality of function blocks each having a predetermined logic function, and (b) at least one wiring layer overlying the rows of logic cells and the channel areas, the wiring layer comprising a plurality of inter-cell wiring areas extending along the rows of logic cells and including interconnects between desired ones of the logic cells and inter-block wiring areas extending along the channel areas and including interconnects between desired ones of the function blocks, wherein (c) each of the inter-cell wiring areas comprises wiring sections respectively associated with the function blocks and having widths which fall within a first range larger than a predetermined width and widths which fall within a second range smaller than the predetermined width, (d) at least one of the inter-cell wiring areas mostly consists of wiring sections having widths falling within the first range, and (e) at least one of the remaining inter-cell wiring areas mostly consists of wiring sections having widths falling within the second range. In a semiconductor integrated circuit device thus constructed, the function blocks may include at least one function block bridging a plurality of ones of the rows of logic cells, the aforesaid one function block being associated with a plurality of wiring sections which are disposed to form part of and bridge a plurality of ones of the inter-cell wiring areas and which include at least one wiring section larger than the other wiring sections and disposed to form part of an inter-cell wiring area mostly consisting of wiring sections having widths within the first range. Furthermore, the wiring sections having widths falling within the second range may include at least one wiring section which forms part of one of the inter-cell wiring areas mostly consisting of wiring sections having widths falling within the first range.

BRIEF DESCRIPTION OF THE DRAWINGS

The drawbacks of a prior-art LSI circuit device and the features and advantages of a circuit device according to the present invention will be more clearly understood from the following description taken in conjunction with the accompanying drawings in which like reference numerals designate similar or corresponding elements, areas and portions and in which:

FIGS. 6A, 6B and 6C are fragmentary plan views showing examples of the automated design layouts of the inter-cell wiring sections respectively illustrated in FIGS. 4A, 4B and 4C.

DESCRIPTION OF THE PRIOR ART

Figure 1:
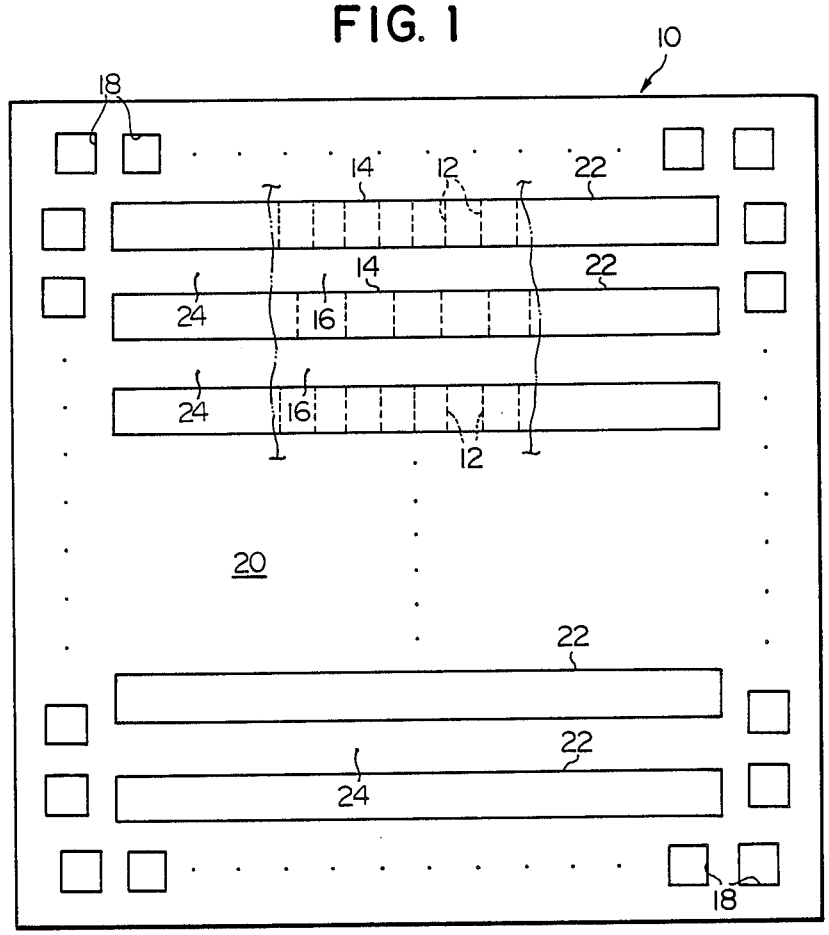
FIG. 1 is a schematic plan view showing a representative example of an automated LSI chip layout of a transistor gate array fabricated on a semiconductor LSI circuit chip.

In FIG. 1 of the drawings is shown a representative example of an automated LSI chip layout of a transistor gate array fabricated on a semiconductor LSI circuit chip 10. The LSI circuit chip 10 herein shown is one of a myriad of chip sections forming an uncommitted master wafer as well known in the art. The gate array comprises a fixed array of logic circuits or cells 12 regularly arranged to form various logic-building or function blocks and each composed of a combination of semiconductor elements such as, typically, transistors. The function blocks composed of the logic cells 12 in turn are arranged in a plurality of rows 14 respectively forming active regions which are regularly spaced apart from each other to define channel areas 16 between the adjacent rows. In such an LSI circuit chip, a complete function block may be formed totally in a single row of logic cells or may be formed in part by logic cells in one row of cells and in part by logic cells in another. Within the peripheral areas of the circuit chip 10 is provided a circuitry including input/output buffer and driver cells 18.

The semiconductor LSI circuit chip 10 further has a typically metallized wiring layer 20 overlying the rows 14 of logic cells and the channel areas 16 intervening between the rows 14 of the logic cells. The wiring layer 20 consists of elongated space portions 22 principally reserved for the formation of user's optional interconnects for the logic cells 12 forming the function blocks and elongated space portions 24 respectively reserved for the formation of user's optional interconnects for the individual function blocks. The space portions 22 principally reserved for the interconnects for the logic cells 12 are provided respectively along the rows 14 of logic cells and the space portions 24 principally reserved for the interconnects for the function blocks are provided respectively along the channel areas 16 intervening between the rows 14 of logic cells as shown.

Figure 2:
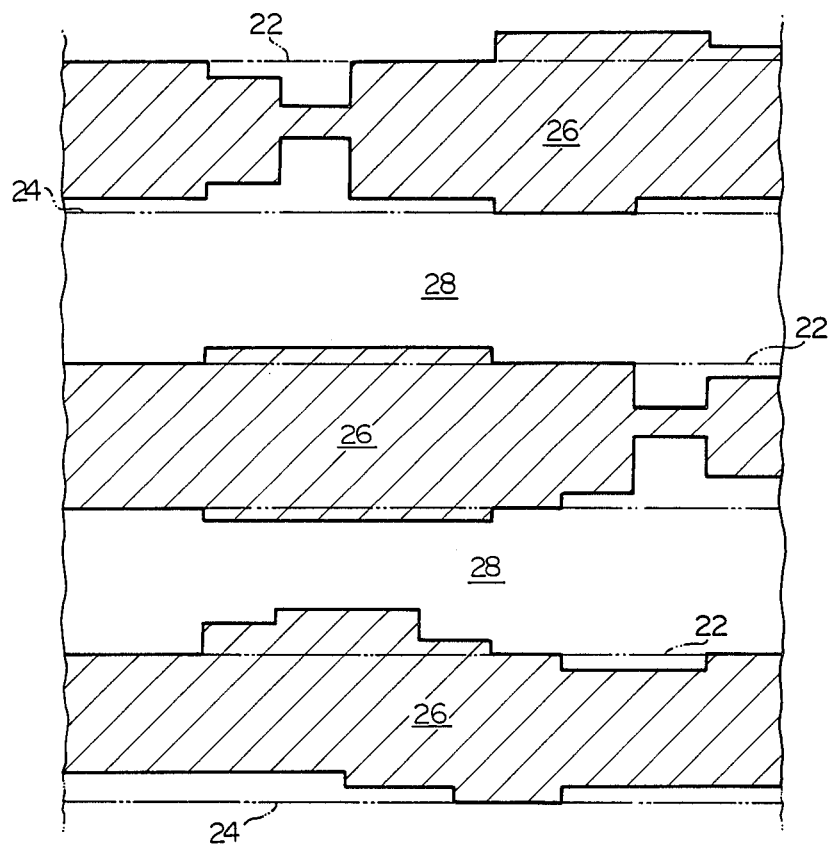
FIG. 2 is a fragmentary plan view schematically showing an example of the pattern with which inter-cell wiring areas are defined in the wiring layer of the LSI circuit chip illustrated in FIG. 1.

FIG. 2 shows an example of the automated design layout with which interconnects for the logic cells 12 of the function blocks of the LSI circuit chip 10 thus fabricated preliminarily are actually formed on the chip 10 in accordance with the user requirement. The user's optional interconnects for the cells 12 are routed along the elongated space portions 22 of the wiring layer 20 principally reserved for the interconnects for the cells 12 and define inter-cell or "intrablock" wiring areas which are commonly represented by reference numeral 26. Between the adjacent ones of these inter-cell wiring areas 26 are defined inter-block wiring areas 28 through which the user's optional interconnects for the function blocks of the circuit chip 10 are routed along the elongated space portions 24 of the wiring layer 20 principally reserved for the interconnects for the function blocks.

The inter-cell wiring areas 26 provided for the interconnects between the logic cells 12 of the function blocks vary in size depending on the logic functions of the blocks. Thus, the size of one inter-cell wiring area 26 may be smaller than that the size of another and there may be an inter-cell wiring area which is so wide as to extend even into one of the adjacent space portions 24 principally reserved for the interconnects for the function blocks as shown. The pattern with which the function blocks are laid out on the chip 10 is ordinarily worked out in consideration of the locations of the individual function blocks with respect to one another so that interconnections complete for implementing desired LSI logics are achieved among the blocks on the chip 10. The fact is however that the function blocks having approximately equally sized inter-cell wiring areas are distributed at random along the reserved space portions 22 and are generally not disposed with regularity in directions in which the rows 14 of logic cells are elongated.

Such random distribution of the function blocks with equally sized inter-cell wiring areas 26 results in irregularities in the width of the inter-block wiring areas 28 through which interconnects are routed between the function blocks in directions in which the rows 14 of logic cells are elongated. As a consequence, each of the inter-block wiring areas 28 defined between such inter-cell wiring areas 26 will have locally broadened and narrowed portions appearing in the direction in which the row 14 of the logic cells associated with the inter-cell wiring area 26 extends. Lengthy interconnect lines in an inter-block wiring area 28 will be more likely to pass through narrowed portions than through broadened portions of the wiring area 28 and short interconnect lines in the inter-block wiring area 28 will occur with approximately uniform likelihood throughout the length of the wiring area 28. The required widths of the individual inter-block wiring areas 28 and accordingly the required spacings between the adjacent rows 14 of logic cells of the circuit chip 10 are therefore dictated by the widths which the inter-block wiring areas 28 have in their narrowed portions. From another point of view, the inter-block wiring areas 28 could not be exploited effectively throughout the widths of their broadened portions. These are among the reasons which account for the commonly averred fact that an LSI circuit chip designed by an automated layout process tends to be larger in size than a chip designed with a hand-made layout. Thus, the irregularities in width of the inter-block wiring areas of a transistor gate array entail enlargement of the chip size and accordingly an increase in production cost of the semiconductor chip to form the gate array.

The present invention contemplates elimination of these problems which have been typically inherent in transistor gate arrays.

DESCRIPTION OF THE PREFERRED EMBODIMENTS

Figure 3:
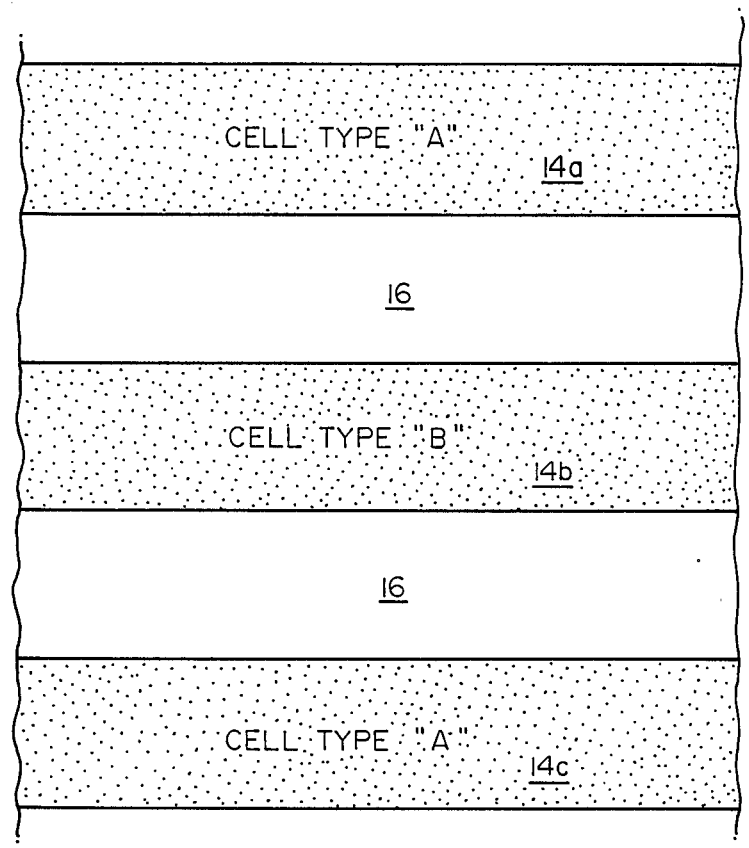
FIG. 3 is a fragmentary plan view of a portion of an LSI circuit device embodying the present invention, the portion of the circuit device being assumed to form part of the LSI circuit chip shown in FIG. 1.

In FIG. 3 of the drawings is shown a portion of an LSI circuit device embodying the present invention. The portion of the LSI circuit device herein shown is assumed to form part of a circuit device generally similar in configuration to the LSI circuit chip shown in FIG. 1. Thus, the LSI circuit which is in part shown in FIG. 3 also has rows of logic cells 14 each composed of logic cells 12 and channel areas 16 intervening between the rows 14 of logic cells. As well known in the art, a standard LSI circuit chip has ten to fifty rows or even more of logic cells provided, although only three are shown in FIG. 3.

In the LSI circuit device shown in part in FIG. 3, the rows 14 of logic cells are assumed to include a first row 14a of logic cells arranged to form function blocks of cell type "A", a second row 14b of logic cells arranged to form function blocks of cell type "B" and a third row 14c of logic cells arranged to form function blocks of the cell type "A". As will be understood as the description proceeds, these cell types "A" and "B" of the function blocks depend on the sizes or, specifically, widths of the inter-cell wiring areas to be provided for the particular function blocks.

Figure 4A:
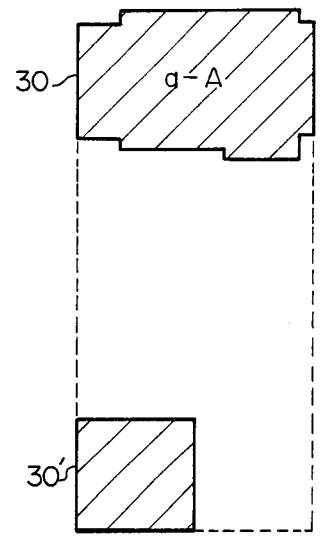
FIGS. 4A, 4B and 4C are fragmentary plan views respectively showing examples of the overall topologies of the inter-cell wiring sections to be formed for some of the function blocks in the chip arrangement shown in part in FIG. 3.
Figure 4B:
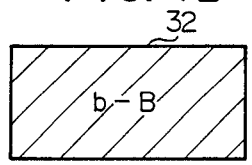
Figure 4B:
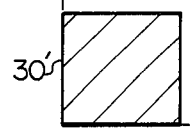
Figure 4C:
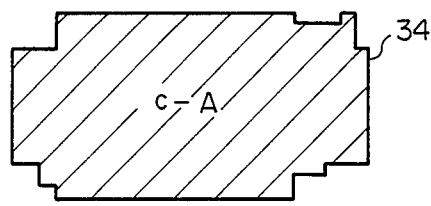

FIGS. 4A, 4B and 4C show examples of the general topologies or general contours of the inter-cell wiring sections to be formed for some function blocks of the rows 14a, 14b and 14c of logic cells in the chip arrangement shown in FIG. 3. These function blocks are assumed to include blocks implementing different logic functions "a", "b" and "c" and, thus, the inter-cell wiring sections for such function blocks include (1) inter-cell wiring sections 30 and 30' for a function block which implements the logic function "a" and forming part of and bridging the first and second rows 14a and 14b of logic cells forming the function blocks of the cell types "A" and "B" as shown in FIG. 4A, (2) an inter-cell wiring section 32 for a function block implementing the logic function "b" and forming part of the second row 14b of logic cells forming the function blocks of the cell type "B" as shown in FIG. 4B, and (3) an inter-cell wiring section 34 for a function block implementing the logic function "c" and forming part of the third row 14c of logic cells forming the function blocks of the cell type "A" as shown in FIG. 4C.

Thus, the combinations of the lowercase letters "a", "b" and "c" and capital letters "A" and "B" as labeled for the wiring sections 30/30', 32 and 34, respectively, indicate the logic functions and sizes of the function blocks composed of the logic cells interconnected by the particular wiring sections 30/30', 32 and 34. Each of the function blocks of the cell type "A" has an inter-cell wiring section with a size larger than a predetermined size, while each of the function blocks of the cell type "B" has an inter-cell wiring section with a size smaller than the predetermined size.

Figure 5:
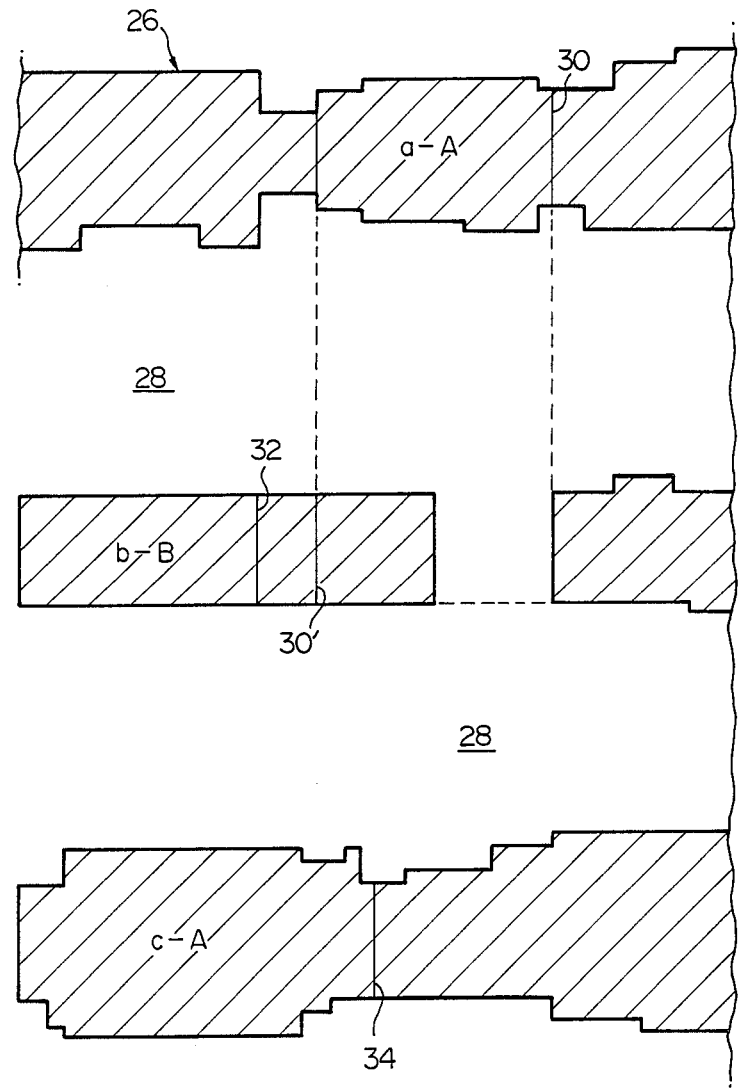
FIG. 5 is a fragmentary plan view similar to FIG. 2 but schematically shows an example of the automated design layout with which inter-cell wiring areas are defined in the wiring layer of the LSI circuit device embodying the present invention.

FIG. 5 shows an example of the design layout of the inter-cell wiring areas defined by the user's optional interconnects arranged to form function blocks including the wiring sections 30, 30', 32 and 34 shown in FIGS. 4A, 4B and 4C. These inter-cell wiring areas as well as the inter-block wiring areas provided in association with the inter-cell wiring areas are defined in a wiring layer overlying the rows 14 of logic cells and channel areas 16 of the circuit chip in part shown in FIG. 3. The wiring layer herein shown is essentially similar to its counterpart in the LSI circuit chip 10 shown in FIG. 1 and comprises, as described with reference to FIG. 1, elongated space portions 22 principally reserved for the formation of user's optional interconnects for the logic cells 12 and elongated space portions 24 reserved for the formation of user's optional interconnects for the function blocks. The space portions 22 principally reserved for the interconnects for the logic cells 12 are assumed to be provided respectively along the first, second and third rows 14a, 14b and 14c, respectively, of logic cells shown in FIG. 3. The space portions 24 principally reserved for the interconnects for the function blocks are provided respectively along the channel areas 16 between these rows 14a, 14b and 14c of logic cells. The wiring layer of the embodiment herein shown is also typically formed of metallization and, where desired, may be overlaid by an additional top-level wiring layer to provide interconnection between any of the devices, cells and/or function blocks of the circuit chip, though not shown in the drawings.

The user's optional interconnects for the cells 12 are routed along the elongated space portions 22 of the wiring layer principally reserved for the interconnects for the cells 12 and define inter-cell wiring areas 26. Likewise, the user's optional interconnects for the function blocks are routed along the elongated space portions 24 of the wiring layer principally reserved for the interconnects for the function blocks and define inter-block wiring areas 26. The inter-cell wiring sections 30 and 30' for the function block implementing the logic function "a" form part of and bridge the inter-cell wiring areas 24 for the first and second rows 14a and 14b of the logic cells forming the function blocks of the cell types "A" and "B", respectively. The inter-cell wiring section 32 for the function block implementing the logic function "b" forms part of the inter-cells wiring area 24 for the second row 14b of the logic cells forming the function blocks of the cell type "B", while the inter-cell wiring section 34 for the function block implementing the logic function "c" forms part of the inter-cell wiring area 24 for the third row 14c of the logic cells forming the function blocks of the cell type "A".

In the wiring layer thus patterned, the wiring sections 30, 30', 32 and 34 are disposed so that an inter-cell wiring section for a function block of the cell type "A" is disposed to form part of an inter-cell wiring area for a row of logic cells forming function blocks of the cell type "A" and an inter-cell wiring section for a function block of the cell type "B" is disposed to form part of an inter-cell wiring area for a row of logic cells forming function blocks of the cell type "B". For the function block (a-A) bridging the first and second rows 14a and 14b of logic cells, there are provided two inter-cell wiring sections 30 and 30' disposed to form part of and bridge the inter-cell wiring areas 24 for the particular rows 14a and 14b, respectively. To this function block (a-A) is allocated the cell type "A" which is allocated to the larger one of the two wiring sections 30 and 30' as shown.

Figure 6A:
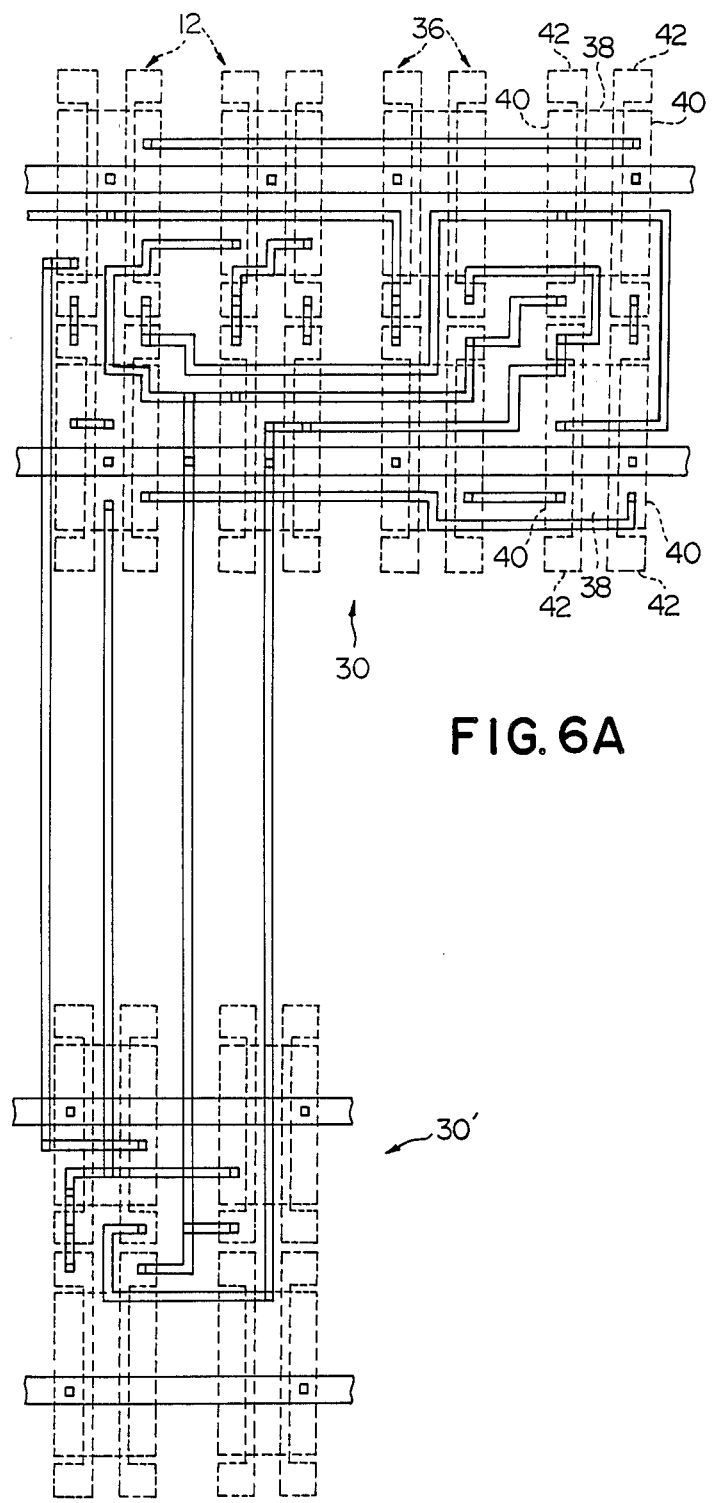

FIGS. 6A, 6B and 6C are fragmentary plan views showing examples of the detailed automated design layouts of the inter-cell wiring sections respectively illustrated in FIGS. 4A, 4B and 4C. Each of the logic cells 12 forming the function blocks for the wiring sections herein shown consists of two pairs of field-effect transistors. Each pair of field-effect transistors 36 having a common drain region 38 in addition to source regions 40 and gate electrodes 42. Such field-effect transistors 36 are interconnected by inter-device and inter-cell wiring lines 44 including supply voltage and grounding straps 46 and 48 as shown.

As will have been from the foregoing description, a semiconductor circuit device according to the present invention is characterized in that (a) each of the inter-cell wiring areas (26) comprises wiring sections (30, 30', 32, 34) respectively associated with the function blocks of the logic cells (12) of each row (16) and each having a width larger or smaller than at least one predetermined width, and that (b) the wiring sections forming the inter-cell wiring areas (26) mostly consist of wiring sections having widths within a predetermined range. Such a range of the widths allowable for the wiring sections (30, 30', 32, 34) is preferably from about 50 per cent to about 160 per cent of the width of each row such as each of the rows (14a, 14b, 14c) of logic cells shown in FIG. 3.

While it has been described that the inter-cell wiring areas 24 of the wiring layer are categorized into two cells types, three or more cell types may be used for grading the sizes of the inter-cell wiring areas. In this instance, the inter-cell wiring sections are disposed so that an inter-cell wiring section for a function block of one cell type is disposed to form part of an inter-cell wiring area for a row of logic cells forming function blocks of the particular cell type and an inter-cell wiring section for a function block of another cell type is disposed to form part of an inter-cell wiring area for a row of logic cells forming function blocks of the other cell type.

Thus, each of the inter-cell wiring areas of an LSI circuit device according to the present invention comprises wiring sections respectively associated with the logic-building function blocks provided in the circuit device and each of such wiring sections has a size or typically width larger or smaller than at least one predetermined size or width. The wiring sections forming at least one of the inter-cell wiring areas mostly consist of wiring sections having sizes or widths larger than the predetermined size or width and the wiring sections forming at least one of the remaining inter-cell wiring areas mostly consist of wiring sections having sizes or widths smaller than the predetermined size or width.

For a function block bridging two or more rows of logic cells, there are provided a plurality of wiring sections disposed to form part of so many inter-cell wiring areas and such a function block has allocated thereto the particular cell type allocated to the largest one of the two or more wiring sections. In other words, a function block bridging a plurality of ones of the rows of logic cells is associated with a plurality of wiring sections which are disposed to form part of and bridge a plurality of ones of the inter-cell wiring areas and which include at least one wiring section larger than the other wiring sections and disposed to form part of an inter-cell wiring area mostly consisting of wiring sections having sizes or widths larger than the predetermined size or width.

If desired, an inter-cell wiring section for a function block of the cell type "B" may be disposed to form part of an inter-cell wiring area for a row of logic cells forming function blocks of the cell type "A". In other words, an inter-cell wiring section for a function block of a particular cell type may be disposed to form part of an inter-cell wiring area for a row of logic cells forming function blocks of a cell type representative of an inter-cell wiring area larger than an inter-cell wiring area represented by the former cell type. This is in consideration of the fact that one function block of an LSI logic circuit is put to use more or less frequently than another and, for this reason, the inter-cell wiring sections for all the function blocks need not or could not be disposed in the inter-cell wiring areas for the rows of logic cells forming the function blocks of the same cell types.

With the inter-cell wiring areas 24 formed and arranged as in accordance with the hereinbefore described principles, there is achieved an advantage that the irregularities in size or width of the wiring areas 24 for the interconnects between the logic cells are averaged and alleviated significantly. Ample spacings can therefore be provided between the adjacent rows of logic cells and, in addition, the inter-block wiring areas can be exploited effectively throughout the widths of the areas. This allows significant reduction in the overall size of a semiconductor LSI circuit chip and accordingly in reduction in the production cost of the chip implementing, for example, a transistor gate array.

What is claimed is:

1. A semiconductor integrated circuit device comprising
    (a) a plurality of rows of logic cells each composed of a combination of semiconductor elements, the rows of logic cells being spaced apart from each other to define channel areas therebetween, said logic cells being arranged to form a plurality of function blocks each having a predetermined logic function, and
    (b) at least one wiring layer overlying said rows of logic cells and said channel areas, the wiring layer comprising a plurality of inter-cell wiring areas extending along said rows of logic cells and including interconnects between desired ones of the logic cells and inter-block wiring areas extending along said channel areas and including interconnects between desired ones of said function blocks, wherein
    (c) each of said inter-cell wiring areas comprises wiring sections respectively associated with said function blocks and each having a width larger or smaller than at least one predetermined width, and
    (d) the wiring sections forming said inter-cell wiring areas comprise wiring sections having widths within a predetermined range of 50 per cent to 160 per cent of said predetermined width.

2. A semiconductor integrated circuit device as set forth in claim 1, in which said function blocks include at least one function block bridging a plurality of ones of said rows of logic cells, said one function block being associated with a plurality of wiring sections which are disposed to form part of and bridge a plurality of ones of said inter-cell wiring areas and which include at least one wiring section larger than the other wiring sections and disposed to form part of an inter-cell wiring area comprising wiring sections having widths within said predetermined range.

3. A semiconductor integrated circuit device comprising
- (a) a plurality of rows of logic cells each composed of a combination of semiconductor elements, the rows of logic cells being spaced apart from each other to define channel areas therebetween, said logic cells being arranged to form a plurality of function blocks each having a predetermined logic function, and
- (b) at least one wiring layer overlying said rows of logic cells and said channel areas, the wiring layer comprising a plurality of inter-cell wiring areas extending along said rows of logic cells and including interconnects between desired ones of the logic cells and inter-block wiring areas extending along said channel areas and including interconnects between desired ones of said function blocks, wherein
- (c) each of said inter-cell wiring areas comprises wiring sections respectively associated with said function blocks and having widths some of which fall within a first range larger than a predetermined width and the others of which fall within a second range smaller than said predetermined width,
- (d) at least one of said inter-cell wiring areas comprises wiring sections having widths falling within said first range, and
- (e) at least one of the remaining inter-cell wiring areas comprises wiring sections having widths falling within said second range.

4. A semiconductor integrated circuit device as set forth in claim 3, in which said function blocks include at least one function block bridging a plurality of ones of said rows of logic cells, said one function block being associated with a plurality of wiring sections which are disposed to form part of and bridge a plurality of ones of said inter-cell wiring areas and which include at least one wiring section larger than the other wiring sections and disposed to form part of an inter-cell wiring area comprising wiring sections having widths within said first range.

5. A semiconductor integrated circuit device as set forth in claim 3, in which said wiring sections having widths falling within said second range include at least one wiring section which forms part of one of said inter-cell wiring areas comprising wiring sections having widths falling within said first range.

* * * * *

UNITED STATES PATENT AND TRADEMARK OFFICE
CERTIFICATE OF CORRECTION

PATENT NO. : 4,791,609
DATED : December 13, 1988
INVENTOR(S) : SOICHI ITO

It is certified that error appears in the above-identified patent and that said Letters Patent is hereby corrected as shown below:

COLUMN 1, LINE 54    Delete "allowed"

Signed and Sealed this

Twenty-fifth Day of July, 1989

Attest:

DONALD J. QUIGG

*Attesting Officer*    *Commissioner of Patents and Trademarks*